United States Patent
Hogan et al.

(10) Patent No.: US 6,466,512 B1
(45) Date of Patent: Oct. 15, 2002

(54) METHOD OF GENERATING ADDRESS CONFIGURATIONS FOR SOLID STATE MEMORY

(75) Inventors: Josh N. Hogan, Los Altos, CA (US); Ron M. Roth, Haifa (IL)

(73) Assignee: Hewlett Packard Company, Palo Alto, CA (US)

( * ) Notice: Subject to any disclaimer, the term of this patent is extended or adjusted under 35 U.S.C. 154(b) by 0 days.

(21) Appl. No.: 09/990,924

(22) Filed: Nov. 13, 2001

(51) Int. Cl.$^7$ .................................................. G11C 8/00
(52) U.S. Cl. .................................. 365/239; 365/230.03
(58) Field of Search ............................. 365/239, 230.03

(56) References Cited

U.S. PATENT DOCUMENTS 4,092,665 A * 5/1978 Saran .......................... 365/239
6,134,173 A * 10/2000 Cliff et al. ............. 365/230.03

* cited by examiner

Primary Examiner—Huan Hoang

(57) ABSTRACT

A method involves the use of a sequence of address configurations covering L memory lines and n address lines. The method includes forming L blocks. A most significant column of each block is filled with the sequence such that the most significant column of each block contains the same unshifted sequence. A least significant column of each block is filled with the sequence such entries in the least significant column of the blocks are shifted cyclically. The L blocks contain address configurations for $L^2$ memory lines and $2n$ address lines.

21 Claims, 10 Drawing Sheets

FIG. 7

ASSIGN A SET OF NON-COVERING ADDRESS CONFGURATONS HAVING A SYMMETRIC DISTANCE OF AT LEAST t+1 — 710

FIG. 8

ASSIGN A SET OF CONSTANT WEIGHT CODE WORDS SATISFYING THE INEQUALITY $(2w + t + 1) \leq n$ — 810

FIG. 9

FORM L BLOCKS — 910

MOST SIGNIFICANT COLUMN OF EACH BLOCK IS FILLED WITH THE SAME SEQUENCE OF ADDRESS CONFIGURATIONS — 912

LEAST SIGNIFICANT COLUMN OF EACH BLOCK IS FILLED WITH A CYCLICALLY SHIFTED SEQUENCE — 914

METHOD OF GENERATING ADDRESS CONFIGURATIONS FOR SOLID STATE MEMORY

BACKGROUND

The present invention relates to information storage devices. More specifically, the present invention relates to address logic for solid state memory.

Portable devices such as PDAs, handheld computers, digital cameras and digital music players include memory for storing data, digital images and MP3 Files. Different types of memory are available for these portable devices. Conventional memory types include flash memory, mini-hard drives, mini-compact discs, and magnetic tape. However, each of these memory types has one or more of the following limitations: large physical size, low storage capacity relatively high cost, poor robustness, slow access time and high power consumption.

Solid state diode-based OTP memory is disclosed in assignee's U.S. Ser. No. 09/875,356 filed Jun. 5, 2001. Compared to the conventional memory, the diode-based memory has a high shock tolerance, low power consumption, fast access time, moderate transfer rate and good storage capacity. The diode-based memory can fit into a standard portable interface (e.g., PCMCIA, CF) of a portable device.

In a diode-based memory device having multiple levels, each level has main memory and address logic (unlike conventional solid state memory such as DRAM). The address logic of the diode-based memory device is programble. The address logic may be programmed after each level has been fabric. Since no masking is required, physical processing is simplified.

Increasing memory capacity is a continuing goal of memory manufacturers. As memory capacity is increased, however, the number of address lines and memory lines is also increased. In turn, address configurations are made longer to accommodate the increase in address lines, and the numbs of address configurations is increased to accommodate the increase in memory lines.

Efficient generation of the address configurations is needed.

SUMMARY

According to one aspect of the present invention, a method involves the use of a sequence of address configurations covering L memory lines and n address lines. The method includes forming L blocks. A most significant column of each block is filled with the sequence such that the most significant column of each block contains the same unshifted sequence. A least significant column of each block is filled with the sequence such that entries in the least significant column of the blocks are shifted cyclically. The L blocks contain address configurations for $L^2$ memory lines and $2n$ address lines.

Other aspects and advantages of the present invention will become apparent from the following detailed description, taken in conjunction with the accompany drawings, illustrating by way of example the principles of the present invention.

BRIEF DESCRIPTION OF THE DRAWINGS

FIG. 7 is an illustration of a first method of generating address configurations for the address logic.

FIG. 8 is an illustration of a second method of generating address configurations for the address logic.

FIG. 9 is an illustration of a method of using a lookup table to extend address configurations for the address logic.

DETAILED DESCRIPTION

Figure 1:
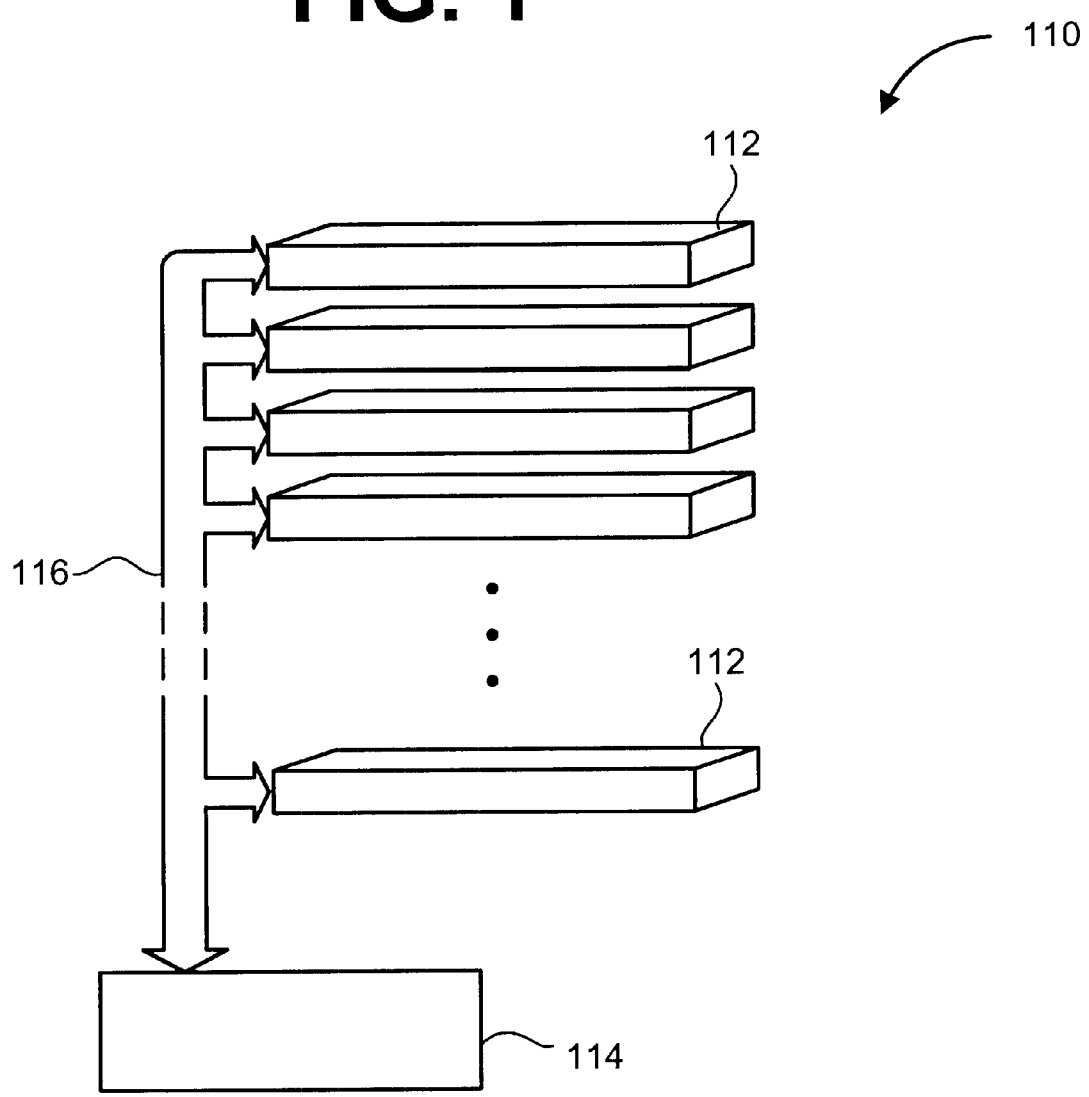
FIG. 1 is an illustration of a multi-level solid state memory device.

As shown in the drawings for the purpose of illustration, the present invention embodied in a diode-based OTP memory device. In the paragraphs below the structure of the OTP memory device will be described, followed by a description of two address protocols. One of the address protocols can provide fault-tolerant address configurations. The other address protocol can provide neighborhood-disjoint address configurations, as well as fault-tolerant address configurations. Fault-tolerant address logic can improve manufacturing yields, and neighborhood-disjoint address logic allows the memory device to be formed at higher resolution. The description of the address protocols will be followed by a description of a method of using a lookup tale to extend the address configurations to large memory arrays.

FIG. 1 shows a multi-level solid state memory device 110. Multiple levels 112 are stacked on top of one another. Each level 112 includes main memo and address logic. The levels 112 are connected to control/interface circuitry 114 by a memory system interface 116. The control/interface circuitry 114 is formed in a substrate. The control/interface circuitry 114 performs error code correction (ECC) and defect management functions, as well as functions for operating the device 110. These functions include setting write voltages, setting write enable lines and controlling power sense striping, addressing the memory by converting logical addresses to address line patterns required to access physical memory locations, and data read processing of sense line outputs.

The system interface 116 includes address lines. Address logic on each level 112 shares the same address lines. When data is written to the device 110, the bits are not stored in contiguous memory elements on a level. Instead, the bit of a word are stored on different levels 112.

If the address logic is fault tolerant, one address line could be defective in ore level, and another address line could be defective at another level, but each level would independently tolerate the defects.

Figure 2:
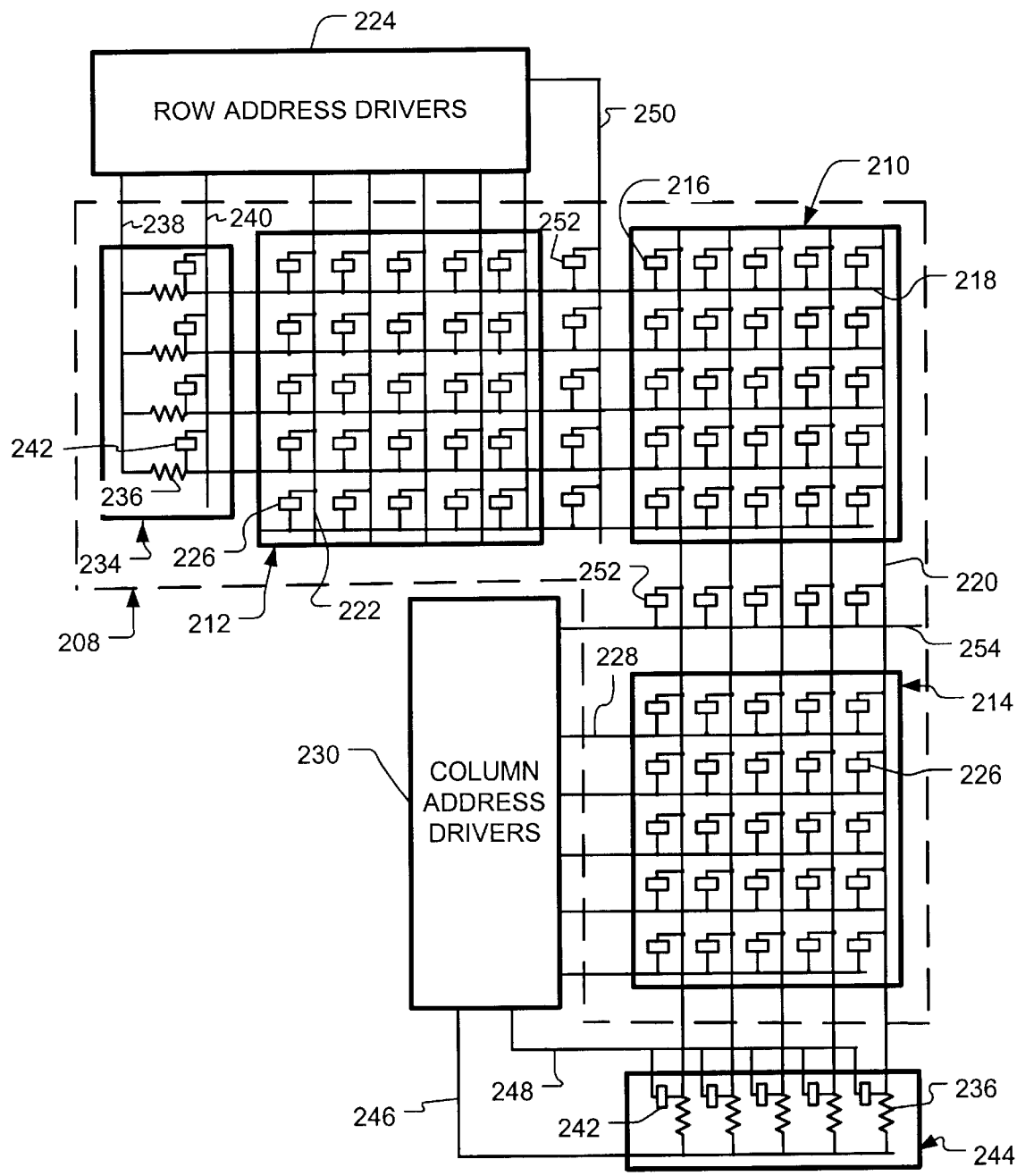
FIG. 2 is an illustration of a level of the solid state memory device, the level including address logic.

Reference is now made to FIG. 2, which shows a level 208 of a solid state memory device. The level 208 includes main memory 210 and programmable address logic 212, 214. The main memory 210 includes a cross point resistive array of OTP memory elements 216, word lines 218 extending along rows of the memory elements 216, and bit lines 220 extending along columns of the memory elements 216. There may be one word line 218 for each row of the memory elements 216 and one bit line 220 for each column of the memory elements 216. Each memory element 216 is located at a cross point of a word line 218 and a bit line 220. Only a relatively small number of memory elements 216 is shown to simplify the illustration of the level 208. In practice, arrays of any size may be used.

A memory line may refer to either a word line 218 or a bit line 220.

The address logic 212, 214 uses combinatorial diode logic to address the memory elements 216 during read and write operations. The address logic 212, 214 includes an OTP row decoder 212 for selecting the word lines 218. The row decoder 212 selects the word lines 218 by decoding addresses supplied on row address lines 222 (the addresses may be supplied by external row address drivers 224). The row decoder 212 includes a plurality of OTP address elements 226. Each address element 226 of the row decoder 212 is at a cross point of a word line 218 and a row address line 222.

The address logic 212, 214 also includes an OTP column decoder 214 for selecting the bit lines 220. The column decoder 214 selects the bit lines 220 by decoding addresses supplied on column address lines 228 (the addresses may be supplied by external column address drivers 230). The column decoder 214 also includes a plurality of OTP address elements 226. Each address element 226 of the column decoder 214 is at the cross point of a bit line 220 and a column address line 228.

One end of each word line 218 terminates at row sense logic 234. The row sense logic 234 includes multiple sense resistors 236, each sense resistor 236 connected between a row power line 238 and an end of a word line 218. A row sense line 240 crosses the word lines 218. The row sense logic 234 also includes multiple sense elements 242, each sense element 242 connected between the row sense line 240 and a word line 218.

One end of each bit line 220 terminates at column sense logic 244. The column sense logic 244 includes multiple sense resistors 236, each sense resistor 236 connected between a column power line 246 and an end of a bit line 220). A column sense line 248 crosses the bit lines 220. The column sense logic 244 also includes multiple sense elements 242, each sense element 242 connected between the column sense line 248 and a bit line 220.

A row programming line 250, between the main memory 210 and the row decoder 212, crosses the word lines 218. Programming elements 252 are connected between the row programming line 250 and the word lines 218.

A column programming line 254, between the main memory 210 and the column decoder 214, crosses the bit lines 220. Programming elements 252 are connected between the column programming line 254 and the bit lines 220.

The memory elements 216, the address elements 226, the sense elements 24 and the programming elements 252 may all be diode-based. This simplifies the fabrication of the level 208.

Figure 3A:
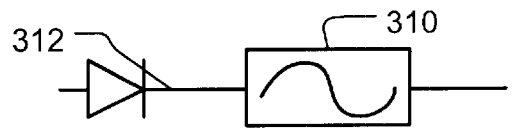
FIGS. 3a–3c are illustrations of different types of programmable elements in the level.
Figure 3B:
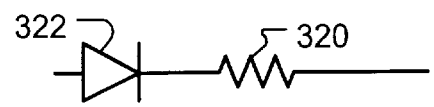
Figure 3C:

Different types of programmable elements 216/226/242/252 are shown in FIGS. 3a–3c. The programmable element of FIG. 3a includes a fuse 310 coupled in series with a diode 312. Prior to programming, the resistance state of such an element is low, with the fuse 310 intact. During programming, the resistance state of the element can be changed from low to high by "blowing" the fuse 310.

The programmable element of FIG. 3b includes a resistor 320 coupled in series with a diode 322. Prior to programming, the resistance state of such an element is low, with the resistor 320 intact. During programming, the resistance state of the element can be changed from low to high by "blowing" the resistor 320.

The programmable element of FIG. 3c includes only a diode 332. Prior to programming, the diode 332 is intact, whereby its resistance state is low. During programming, the diode 332 can be opened to change its resistance state from low to high. Such a diode 332 functions as a fuse. In the alternative, the diode 332 can function as an anti-fuse, going from a high resistance state to a low resistance state during programming.

The programmable elements 216/226/242/252 are not limited to the types shown in FIGS. 3a–3c. For example, the programmable elements 216/226, 242/252 could include transistors instead of diodes.

Figure 4:
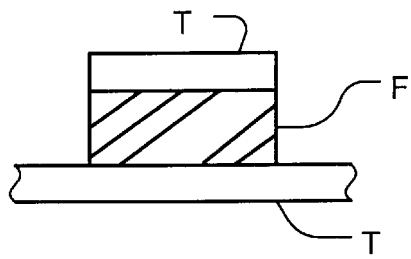
FIG. 4 is another illustration of a programmable element.

Returning to FIG. 2, the level 208 may be fabricated as follows. Column lines 220 are formed on a substrate, a multi-layer film of silicon is formed on the column lines 220, and word lines 218 are formed on the film. Each programmable element 216/226/242/252 may be formed as that portion of the film (F) between two crossing traces (T) (see FIG. 4). The size of the pro grammable element 216/226/242/252 is determined by the overlapping area between crossing lines and the thickness of the film. For example, a diode in main memory 210 may be formed as that portion of the film between crossing word and bit lines 218 and 220.

The different layers of the film have appropriate dopings (and/or a combination of crystalline and amorphous silicon) to form the diodes 312, 322, 332. Additional layers with appropriate dopings can be added to form resistors 320, fuses 310, or anti-fuses. The sense resistors 236 may be formed by modifying the ends of the word and bit lines 218 and 220. The row and column address drivers 224 and 230 may be formed on the substrate, as part of the control/interface circuitry 114.

Data may be written to the main memory 210 by supplying row and column addresses to the row and column decoders 212 and 214. A write current flows through a selected word line 218 and a selected bit line 220 and, therefore, flows through the memory element 216 at the cross point of the selected word and bit lines 218 and 220. Magnitude of the write current is sufficient to change the resistance state of the selected element (e.g., by opening the fuse 310 of FIG. 3a, opening the resistor 320 of FIG. 3b, opening the diode 332 of FIG. 3c, shorting the anti-fuse).

The resistance state of a memory element 216 may be sensed by supplying row and column addresses to the row and column decoders 212 and 214. A voltage is applied to the row sense line 240 and a voltage of opposite polarity is applied to the column sense line 248. A sense current flows through a selected word line 218 and a selected bit line 220 and, therefore, flows through the memory element 216 at the cross point of the selected word and bit lines 218 and 220. Magnitude of the sense current indicates the resist once state of the selected memory element 216.

Figure 4A:
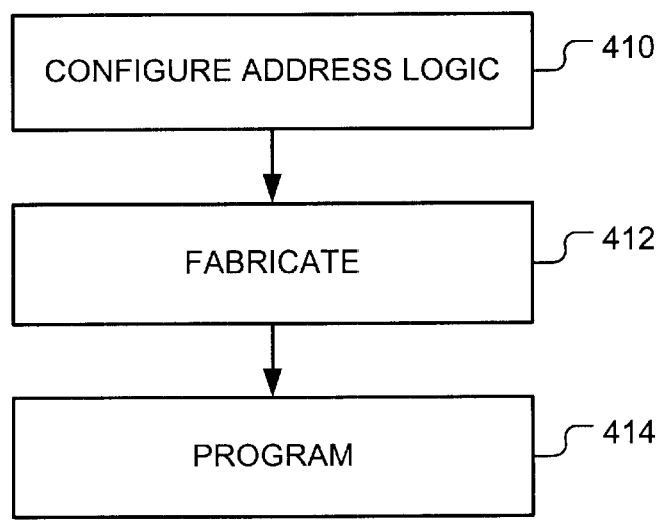
FIG. 4a is an illustration of a method of forming the address logic.

Reference is now made to FIG. 4a. The row and column decoders 212 and 214 may be configured (410) prior to device fabrication (412), and programmed (414) after the level 208 has been fabricated. The decoders 212 and 214 may be configured by assigning address configurations to memory lines. Each address configuration contains a bit pattern of logic 1's and logic 0's. Each bit in an address configuration corresponds to a programmable address element 226 connected to a memory line. The address elements 226 are fabricated according to the address configurations. For example, an address element 226 corresponding to an address configuration bit value of '0' has a different current-carrying capability than an address elements 226 corresponding to an address configuration bit value of '1'. Fabrication and programming of the address elements will now be described in greater r detail. Address protocols for generating the address configurations will be discussed later.

Figure 5:
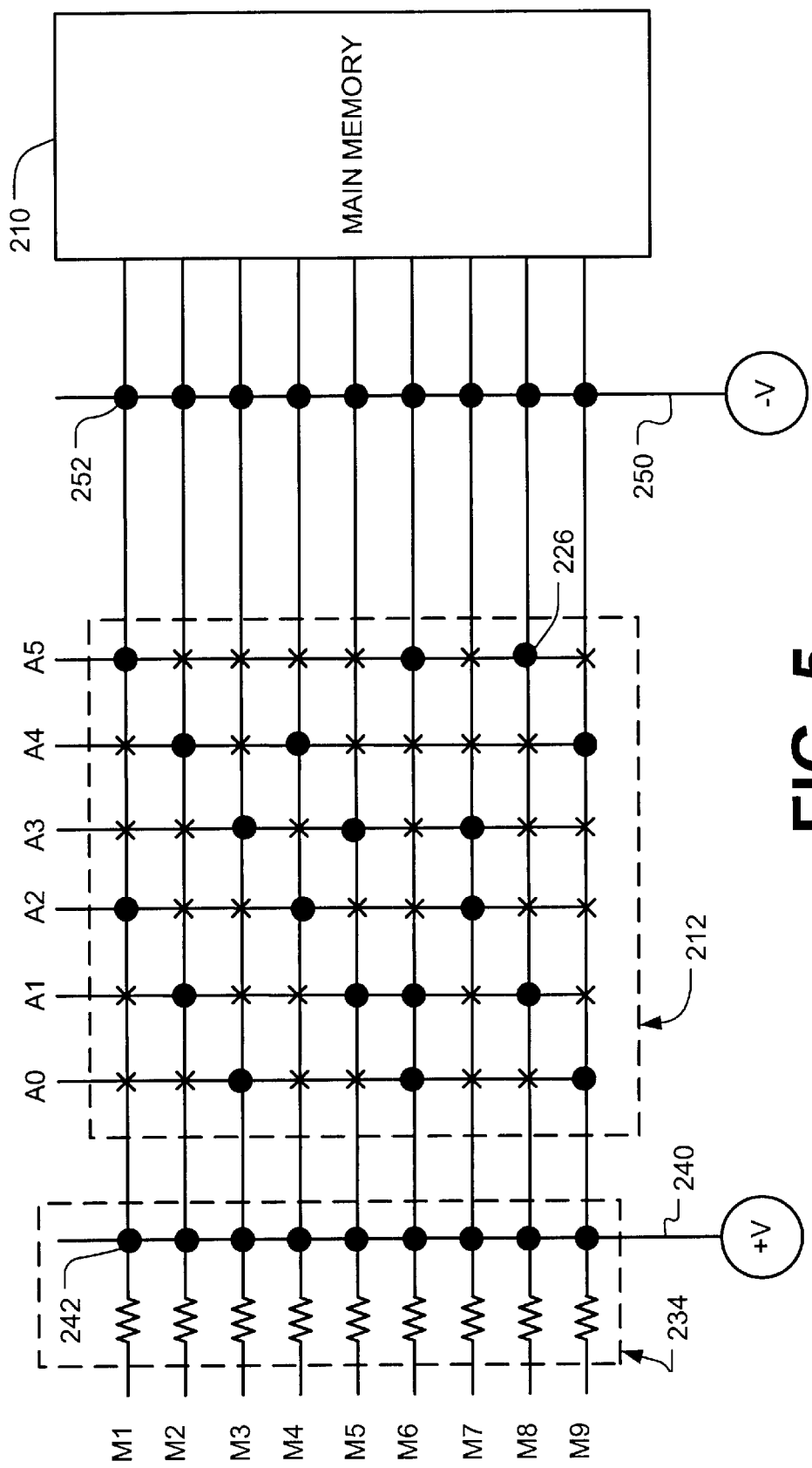
FIG. 5 is an illustration of address patterns for memory lines.

Reference is made to FIG. 5. The higher current-carrying capability element, indicated by filled-in zeros (●), correspond to a first logic value of an address configuration bit. The lower current-carrying capability elements, indicated by crosses (X), correspond to a second logic value of an address configuration bit state. The address elements 226 indicated by filled-in zeros will not have their resistance states changed during programming. The address elements indicated by crosses will have their resistance states changed during programming. Merely for the purpose of illustration, the elements indicated by crosses correspond to logic '0' and the elements indicated by filled-in zeros correspond to a logic '1'. A logic '1' does not necessarily correspond to a high voltage.

During programming of the row decoder 212, a voltage (−V) is applied across the row programming line 250, and a voltage of opposite polarity (+V) is applied to the row sense line 240. (During programming of the column decoder 214, a voltage is applied across the column programming line 254, and a voltage of opposite polarity is applied to the column sense line 248.) This will effectively apply a voltage across two diodes connected back-to-back. The voltage is applied in such a manner that all address elements are reversed-biased and the sense elements are forward-biased. Consequently, a current flows through the address elements 226. This current breaks the links or address elements 226 denoted by crosses, but the current does not creak the links of the address elements 226 denoted by filled-in zeros. This, the address elements 226 denoted by filled-in zeros remain intact. The memory lines M1–M9 for the row decoder 212 are connected to different patterns of intact and changed address elements 226, such that a set of address lines that will de-select all but one of the memory lines.

Figure 5A:
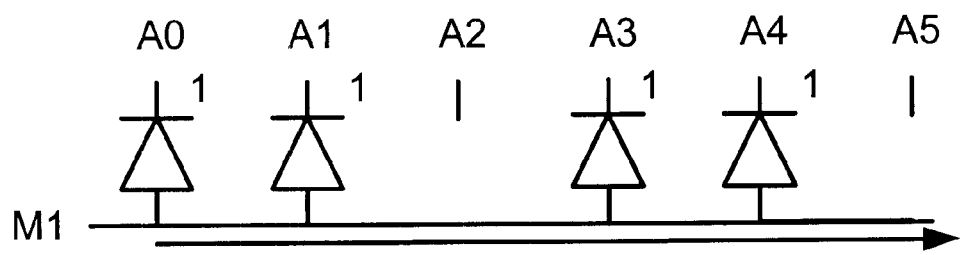
FIGS. 5a–5b are illustrations of diode patterns for memory lines.

Additional reference is made to FIG. 5a, which shows a diode pattern for a memory line (after programming). The diodes in the address elements 226 are active elements that form wired logic elements. If an address $a_0 a_1 a_2 a_3 a_4 a_5 =$ 110110 is applied to address lines A0–A5, the diodes connected to address lines A0, A1, A3 and A4 will be reverse-biased. As a result, current (indicated by the arrow) is allowed to flow through the memory line to the main memory 210.

Figure 5B:
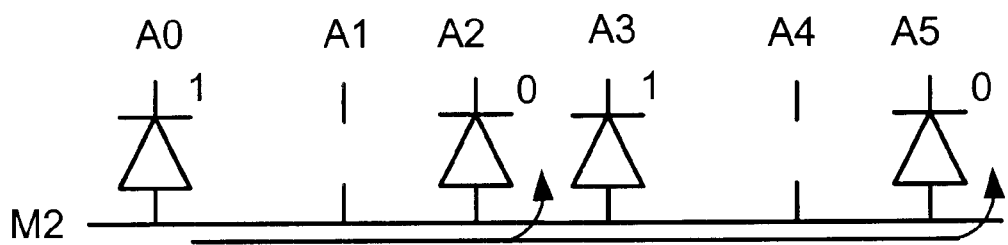

The same address $a_0 a_1 a_2 a_3 a_4 a_5 = 110110$ will de-select the memory line shown in FIG. 5b. For example, applying a logic '0' to address line A2 will cause the diode connected between address line A2 and memory line to become forward biased. As a result, current will be shunted through the forward-biased diode and will not flow to the main memory 210.

Figure 6A:
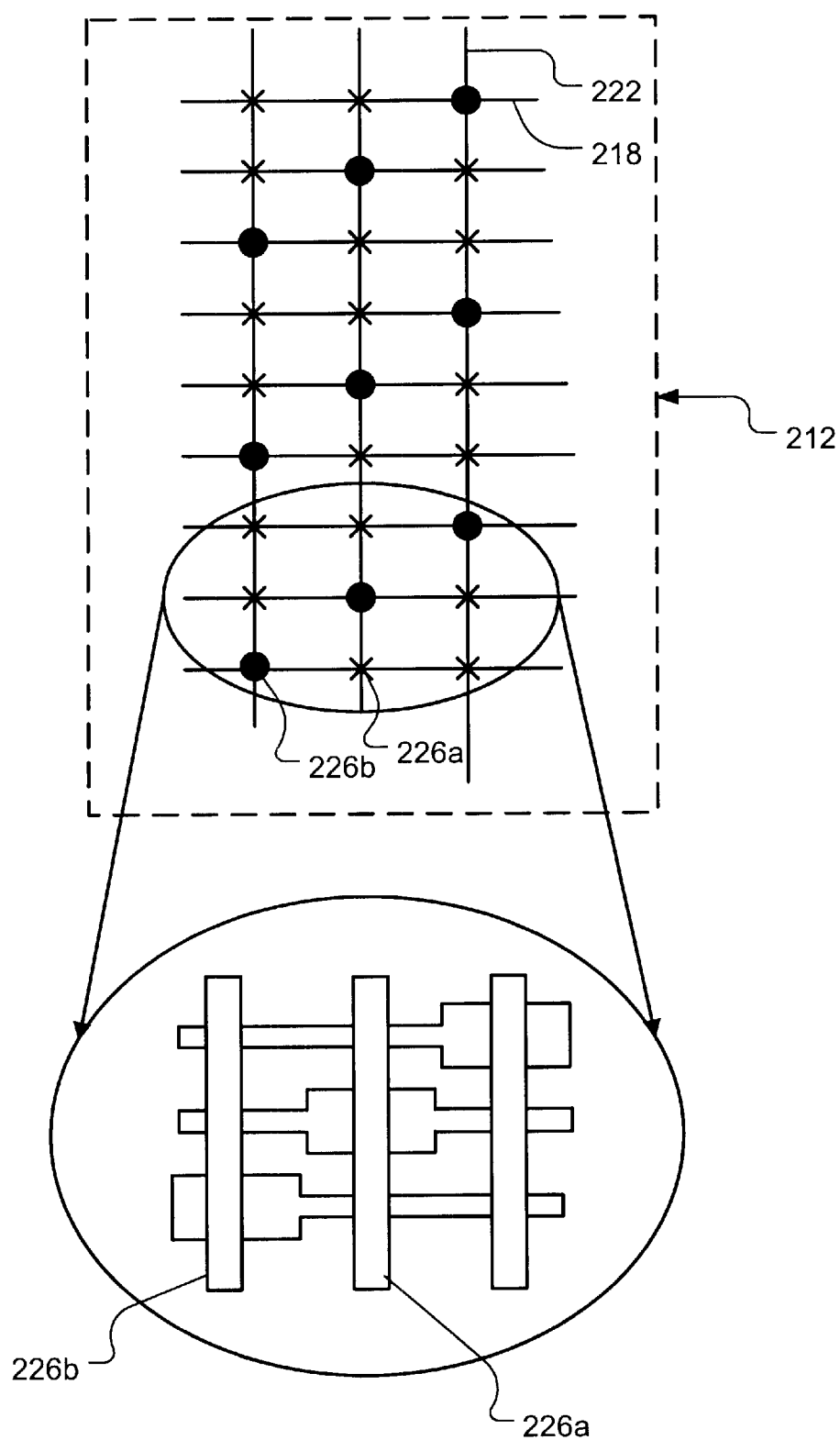
FIGS. 6a–6c are illustrations of different layouts for address elements of the address logic.
Figure 6B:
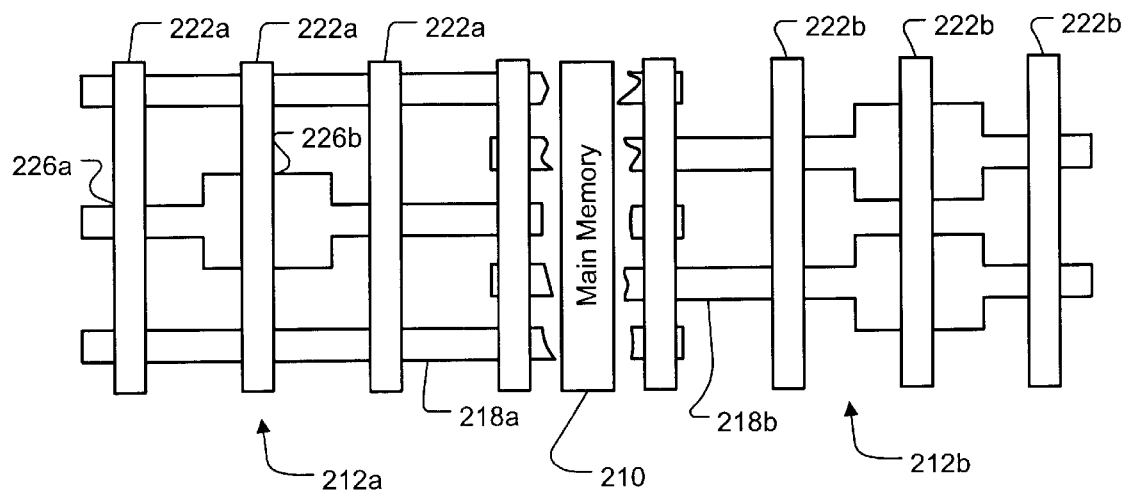
Figure 6C:
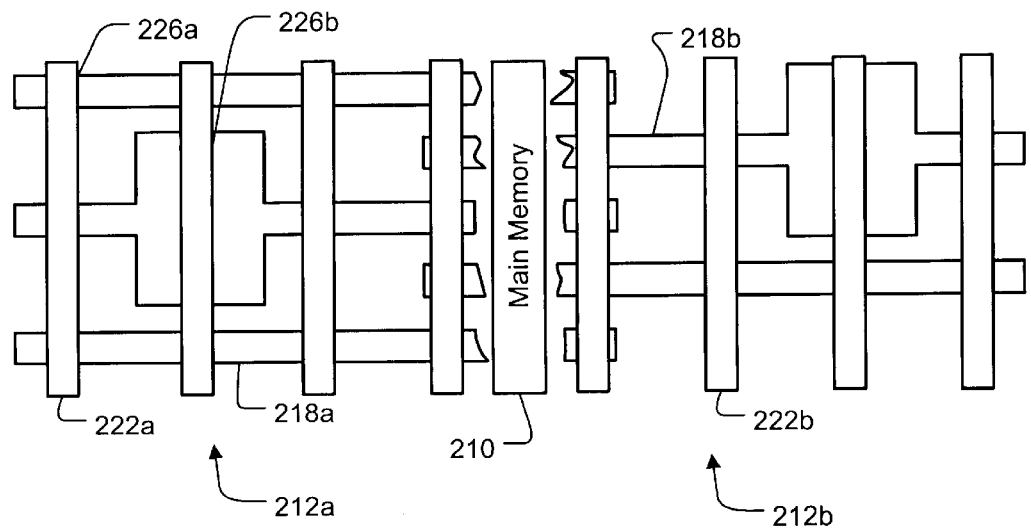

Reference is now made to FIGS. 6a–6c. The address elements 226b having the higher current-carrying capability may be made physically larger than the address elements 226 a having the lower current-carrying capability. If an address protocol can guarantee that no column has adjacent enlarged address elements 226b, then the address logic may have the configuration shown in FIG. 6a. FIG. 6a shows a row decoder 212 in which columns do not contain any adjacent enlarged address elements 226b. Although not shown as such, the address elements 226a and 226b may be formed at full contact pitch.

If the address protocol cannot provide such a guarantee, whereby the address logic could include adjacent enlarged address elements in a column, the distance between word lines 18 may be increased. However, this would reduce the data storage density of the main memory.

Instead, the row decoder 212 may be divided into two spaced-apart sets 212a and 212b, as shown in FIG. 6b. Odd-numbered word lines 218a are inter digitated with even-numbered word lines 218b. A first set of address lines 222a crosses the odd-numbered word lines 218a, and a second set of address lines 222b crosses the even-numbered word lines 218b. The first and second sets of address lines 222a and 222b receive the same address signal.

This approach allows the size of adjacent address elements 226b to be enlarged threefold, yet it still allows the other address elements 226a to be fabricted at higher resolution. If the address protocol can guarantee that no column has adjacent enlarged address elements 226b, the size of the non-adjacent enlarged memory elements 226b can be increased fivefold (see FIG. 6c).

FIGS. 6a–6c were just described in connection with the row decoder 212. However, the same principles may be applied to the column decoder 214.

The address protocol involves a 1:1 mapping of n-bit address configurations to each one of L memory lines (e.g., L rows or L columns) so that no two rows ark assigned the same address configuration and that no two columns are assigned the same address configuration.

Consider the address configurations shown in Table 1. There are six memory lines M1–M6 and four address lines A0–A3. A logic '0' applied to an address line will de-select all memory lines connected to that address line by intact elements. If an address $a_0 a_1 a_2 a_3 = 1100$ is supplied to address lines A0, A1 A2 and A3, all memory lines M2–M6 except the first memory line M1 will be de-selected (the first and second address elements of the first memory line M1 are left intact, while the third and fourth address elements of the first memory line a not).

TABLE 1

|    | A0 | A1 | A2 | A3 |
|----|----|----|----|----|
| M1 | ●  | ●  | X  | X  |
| M2 | ●  | X  | ●  | X  |
| M3 | ●  | X  | X  | ●  |
| M4 | X  | ●  | ●  | X  |
| M5 | X  | ●  | X  | ●  |
| M6 | X  | X  | ●  | ●  |

Because the address lines are physically and electrically connected to corresponding address elements on all of the layers, an address line can be rendered unusable by a single defective connection on any of the layers. An address line might be rendered unusable by defects occurring over time due to aging or environmental processes. If one of the address lines A0, A1, A2 or A3 becomes unusable, that address line will be unable to de-select certain memory lines. If address line A3 becomes defective, it will not be able to de-select memory lines M2, M4 and M6.

This problem may be avoided by use of an address protocol that provides fault-tolerant address configurations. The fault-tolerance has a built-in redundancy that allows the memory device to function correctly even if defects arise.

Thus the fault tolerance can improve manufacturing yields. The cost is an increase in address lines.

Reference is made to FIG. 7. Fault-tolerance may be achieved by assigning a set of non-covering address configurations having a symmetric distance at least t+1, where t is the maximum allowable number of defective address lines (710).

Certain terms will now be explained. Let $u_1, u_2 \in \{0,1\}^n$. The unidirectional distance $d_u(u_1, u_2)$ is the number of positions where $u_1$ has 1's and $u_2$ has 0's. The symmetric distance is $d_s(u_1, u_2) = \min\{d_u(u_1, u_2), d_u(u_2, u_1)\}$. The Hamming distance is $d_H(u_1, u_2) = d_u(u_1, u_2) + d_u(u_2, u_1)$. The Hamming distance is at least twice the symmetric distance; that is, $d_H(u_1, u_2) \geq 2\, d_s(u_1, u_2)$. For example, if $u_1 = 1110$ and $u_2 = 1001$, then $d_u(u_1, u_2) = 2$ and $d_u(u_2, u_1) = 1$; $d_H(u_1, u_2) = 3$; and $d_s(u_1, u_2) = 1$. For a set U of at least two n-bit words, the symmetric distance $d_s(U)$ is the minimum symmetric between any two distinct words in the set U, and the Hamming distance is $d_H(U)$ is the minimum Hamming distance between any two distinct words in the set U.

If $d_u(u_1, u_2) = 0$, then $u_2$ covers $u_1$. Therefore, $d_s(u_1, u_2) = 0$ if and only if either $u_2$ covers $u_2$ or $u_1$ covers $u_2$. Memory lines are assigned address configurations such that no address configuration covers the other. This constraint prevents a single address from selecting more than one memory line.

Thus, if the n-bit words in a set are non-covering, then the set of words may be assigned as address configurations for n address lines.

One set of words satisfying these constraints are t-Sperner (n,L) code words. A t-Sperner(n,L) code is a set U that consists of L n-bit words, such that $d_s(U) \geq t+1$. An example of a 1-Sperner(7,6) code is U={1100100, 1010010, 1001101, 0110001, 0101010, 0011100}. The Hamming distance is $d_H(U) = 4$. Even if t=1 of the address lines becomes defective, no word will cover the other.

The address words may be constant weight code (CWC) words, which are a type of t-Sperner words. A set C of n-bit words is a CWC (n,2t+2,w) if each word in the set C has a Hamming weight (w) and dH(C) >2 t+2. These conditions imply that C is a t-Sperner(n,L) code.

Consider the address configurations in Table 2. An additional three address lines (A4, A5 and A6) are added. No address configuration covers the other even when any t=1 address lines are unusable. Thus the maximum a lowable number of defective address lines is t=1.

TABLE 2

|    | A0 | A1 | A2 | A3 | A4 | A5 | A6 |
|----|----|----|----|----|----|----|----|
| M1 | •  | •  | X  | X  | •  | X  | X  |
| M2 | •  | X  | •  | X  | X  | •  | X  |
| M3 | •  | X  | X  | •  | X  | X  | •  |
| M4 | X  | •  | •  | X  | X  | X  | •  |
| M5 | X  | •  | X  | •  | X  | •  | X  |
| M6 | X  | X  | •  | •  | •  | X  | X  |

If address line A1 becomes unusable, the remaining six address lines A0 and A2–A6 will be able to unambiguously select each of the six memory lines M1–M6. An address $a_0 a_2 a_3 a_4 a_5 a_6 = 100100$ will still de-select all memory lines M2–M6 except the first memory line M1.

The memory device may be fabricated at a higher resolution by using an address protocol that generates neighborhood-disjoint address configurations. Such an address protocol guarantees that no column has adjacent enlarged address elements 226b.

Referring now to FIG. 8, the neighborhood-disjoint address configurations are generated by assigning a set of constant weight code words satisfying the inequality $(2w+t+1) \leq n$, where w is the weight of the code words, n is the number of address lines, and t is the maximum allowable number of defective address lines (810).

Let T(b) be the address configuration of the $b^{th}$ memory line Mb. If the addressing is neighborhood disjoint, then T(b) and T(b+1) are disjoint for every b, whereby adjacent addresses do not have 1's at the same locations. That is, the addressing is neighborhood disjoint if $T(b) \Lambda T(b+1) = 0$ for all b and, in addition, $T(L) \Lambda T(1) = 0$. The operator $\Lambda$ represents a bit-wise "AND."

Consider the address configurations shown in Table 3. The Hamming weight is w=3, the number of address lines is n=9, and the maximum allowable number of defective address lines is t=1. No column has adjacent enlarged diodes (represented by filled-in zeros); therefore, the address configurations are neighborhood-disjoint. Moreover, any one address line may be unusable, yet the remaining address lines can still unambiguously select a memory line. The cost of the fault tolerance and neighborhood-disjoin endless is an increase in the number of address lines from four to nine.

TABLE 3

|    | A0 | A1 | A2 | A3 | A4 | A5 | A6 | A7 | A8 |
|----|----|----|----|----|----|----|----|----|----|
| M1 | •  | •  | X  | X  | •  | X  | X  | X  | X  |
| M2 | X  | X  | •  | X  | X  | •  | X  | •  | X  |
| M3 | •  | X  | X  | •  | X  | X  | •  | X  | X  |
| M4 | X  | •  | •  | X  | X  | X  | X  | X  | •  |
| M5 | X  | X  | X  | •  | •  | X  | X  | •  | X  |
| M6 | X  | X  | X  | X  | X  | •  | •  | X  | •  |

The address configurations of Table 3 are selected from a t-Sperner(n,L) code, where in this example, t=1, n=9 and L=6. To satisfy this neighborhood-disjoint property, the address configuration assigned to the $k^{th}$ memory line (Mk) is selected randomly from the remaining code words that are neighborhood-disjoint with the configuration assigned to the $k-1^{th}$ memory line. If a neighborhood-disjoint code word cannot be found among the remaining code word the $k-1^{th}$ address configuration is deleted, and another selection for the $k-1^{th}$ address configuration is made. Then the $k^{th}$ address configuration is selected.

Whether fault-tolerant only, neighborhood-disjoint only, or fault-tolerant and neighborhood-disjoint, the address configurations may be assigned to the memory lines by using a lookup table. The lookup table could provide all of the n-bit address configurations for a memory device having n address lines and memory lines. However, such a lookup table can become prohibitively large as storage capacity of the memory device is increased.

FIG. 9 illustrates a method involving a lookup table that provides a sequence of n-bit address configurations for n address lines and L memory lines. The method includes using the lookup table to generate address configurations for 2n address lines and $L^2$ memory lines.

Reference is now made to FIG. 9. A total of L blocks is formed (910). A "most significant column" will refer to the left half of each block. A "least significant column" will refer to the right half of each block.

The most significant column of each block is filled with the sequence such that the most significant column of each block contains the same sequence (912). The $i^{th}$ entry in the most significant column of each block is equal to the $i^{th}$ entry of the lookup table.

The least significant column of each block is filled with the sequence such that the sequence in the second block is shifted cyclically with respect to the sequence in the first block, the sequence in the third block is shifted cyclically with respect to the sequence in the second block, and so on (914). The sequences are cyclically shifted such that the $i^{th}$ entry in the least significant column of $k^{th}$ block is equal to the $(i+s(k))^{th}$ entry of the lookup table, where $s(k)$ is the amount of shift in the $k^{th}$ block relative to the first block. L should be subtracted from $i+s(k)$ when this sum is greater than L.

When L is odd, the amount of shift $s(k)$ of the least significant column in the $k^{th}$ block may be obtained from the amount of shift $s(k-1)$ in the $k-1^{th}$ block less 2. That is, $s(k)=s(k-1)-2$. If the subtraction results in a negative value, L is added. That is $s(k)$ $s(k-1)-2+L$ if $s(k-1)<2$. The same applies when L is even, except for the $(L/2+1)^{st}$ block, where an odd value of $s(L/2+1)$ is selected so that the neighborhood disjoint property is not violated.

The cyclical shift $s(k)$ for each block (k) is distinct. As a result, the L blocks contain address configurations for $L^2$ memory lines and 2n address lines.

A first example of the FIG. 9 method will now be provided. A lookup table shown in Table 4 provides address configurations for L=3 memory lines, n=3 address lines, and t=0. 1. The address configurations form the sequence ABC, where A, B and C represent 3-bit configurations $001_b$, $010_b$, and $100_b$, respectively.

The method of FIG. 9 is used to generate neighborhood-disjoint address configuration for 2n=6 address lines and $L^2=9$ memory lines. As shown in Table 5, the most significant column ($b_0$) of each block has the same unshifted sequence (ABC), with the entry in the $i^{th}$ most significant column being the same as the $i^{th}$ entry of the lookup table of Table 4. The sequence of each block in the least significant column ($b_1$) is shifted. In this example, $s(1)=0$, $s(2)=1$, and $s(3)=2$ (no shift in the first block, a shift of 1 for the second block, and a shift of 2 for the third block). Still, the neighborhood-disjoint property is maintained in this larger addressing protocol.

TABLE 4

| i | address configuration |
|---|---|
| 1 | A |
| 2 | B |
| 3 | C |

TABLE 5

| | i | $b_0$ | $b_1$ |
|---|---|---|---|
| Block 1 | 1 | A | A |
| | 2 | B | B |
| | 3 | C | C |
| Block 2 | 1 | A | B |
| | 2 | B | C |
| | 3 | C | A |
| Block 3 | 1 | A | C |
| | 2 | B | A |
| | 3 | C | B |

Another example is provided in Table 6. The sequence ABCD represents L=4 neighborhood-disjoint address configurations for n address lines and four memory lines. The asterisk (*) assumes that the address configurations D and B are neighborhood-disjoint and that the address configurations A and D are neighborhood-disjoint. That is, AAD=0; and BAD=0.

The most significant column ($b_0$) of each block has the same sequence (ABCD), wil the $i^{th}$ entry in each most significant column ($b_0$) being the same as the $i^{th}$ entry of the sequence. The sequence in the least significant column ($b_1$) changes its phase at each block. In this example, $s(1)=0$, $s(2)=2$, $s(3)=3$ and $s(4)=1$. Still, the neighborhood-disjoint property is maintained in this laser addressing protocol, except that the last 2n-bit configuration is disjoin from the first one.

TABLE 6

| | $b_0$ | $b_1$ |
|---|---|---|
| BLOCK 1 | A | A |
| | B | B |
| | C | C |
| | D | D |
| BLOCK 2 | A | C |
| | B | D |
| | C | A |
| | D | B |
| BLOCK 3 | A | D* |
| | B | A |
| | C | B |
| | D | C |
| BLOCK 4 | A | B |
| | B | C |
| | C | D |
| | D | A |

If the address configurations for the L=4 memory lines can tolerate up to t defective address lines (out of n address lines), then a total of $L^2=16$ memory lines can tolerate the same number of defective address lines. Moreover, up to t defective address lines may be in the most significant column, and up to t defective address lines may be in the least significant column.

In this example, the neighborhood-disjoint property does not hold cyclically, unless the n-bit configuration address A** is replaced by an n-bit configuration address that is neighborhood-disjoint with the configuration addresses D and A.

Instead of replacing A**, a "twin" table can be constructed and appended to Table 6. Table 7 is such a twin table (still under the assumption that BAD=0). Table 7 is not cyclic; however, if AAC=0, Table 7 can be appended to Table 6 without violating the neighborhood-disjoint property. Similarly, if AAC=0, Table 6 can follow Table 7 without violating that property.

TABLE 7

| | $b_0$ | $b_1$ |
|---|---|---|
| BLOCK 1 | A | C |
| | B | D |
| | C | A |
| | D | B |
| BLOCK 2 | A | A |
| | B | B |
| | C | C |
| | D | D |
| BLOCK 3 | A | B |
| | B | C |
| | C | D |
| | D | A |
| BLOCK 4 | A | D |
| | B | A |
| | C | B |
| | D | C |

Figure 10A:
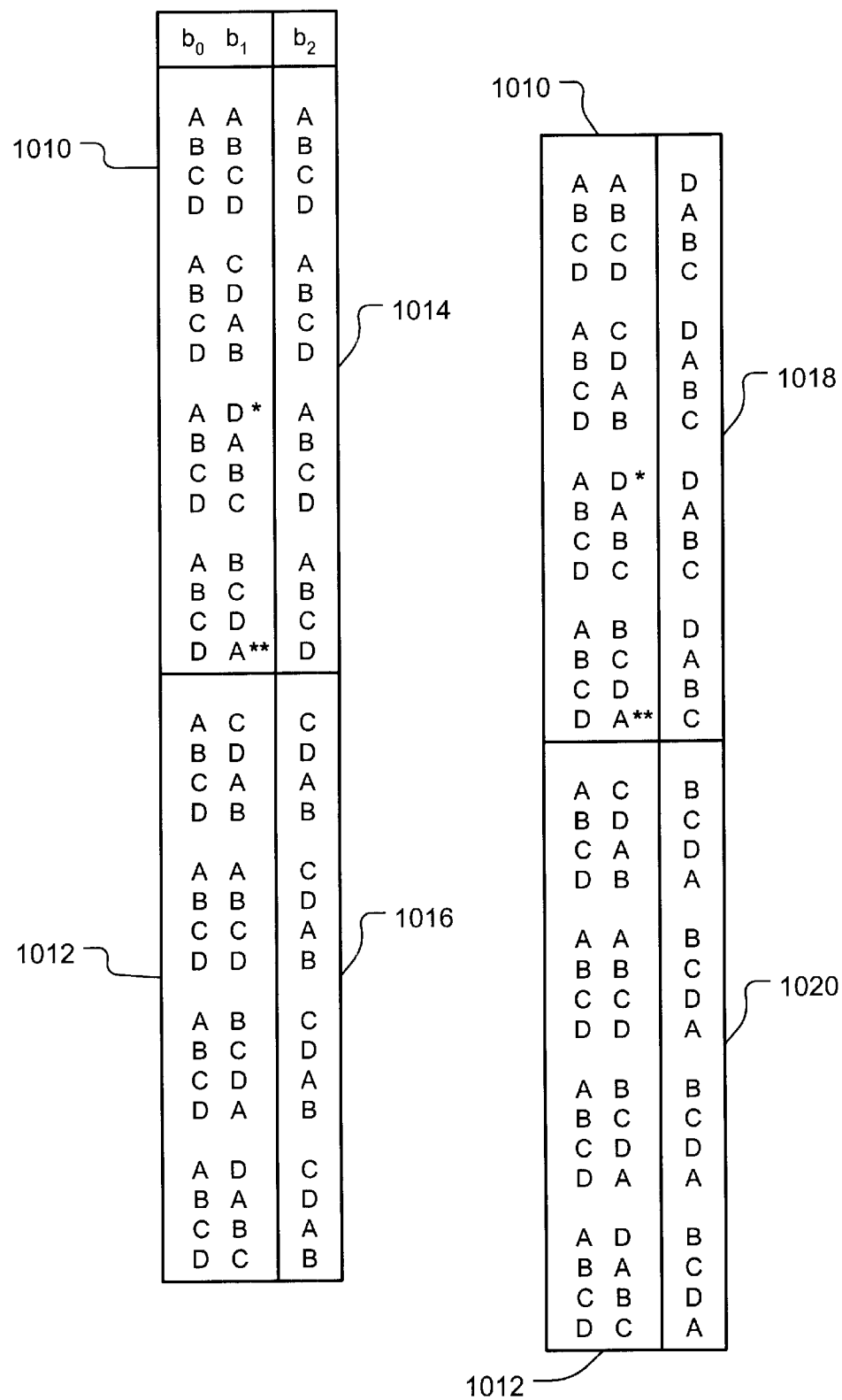
FIGS. 10a and 10b illustrate exemplary twin lookup tables.
Figure 10B:
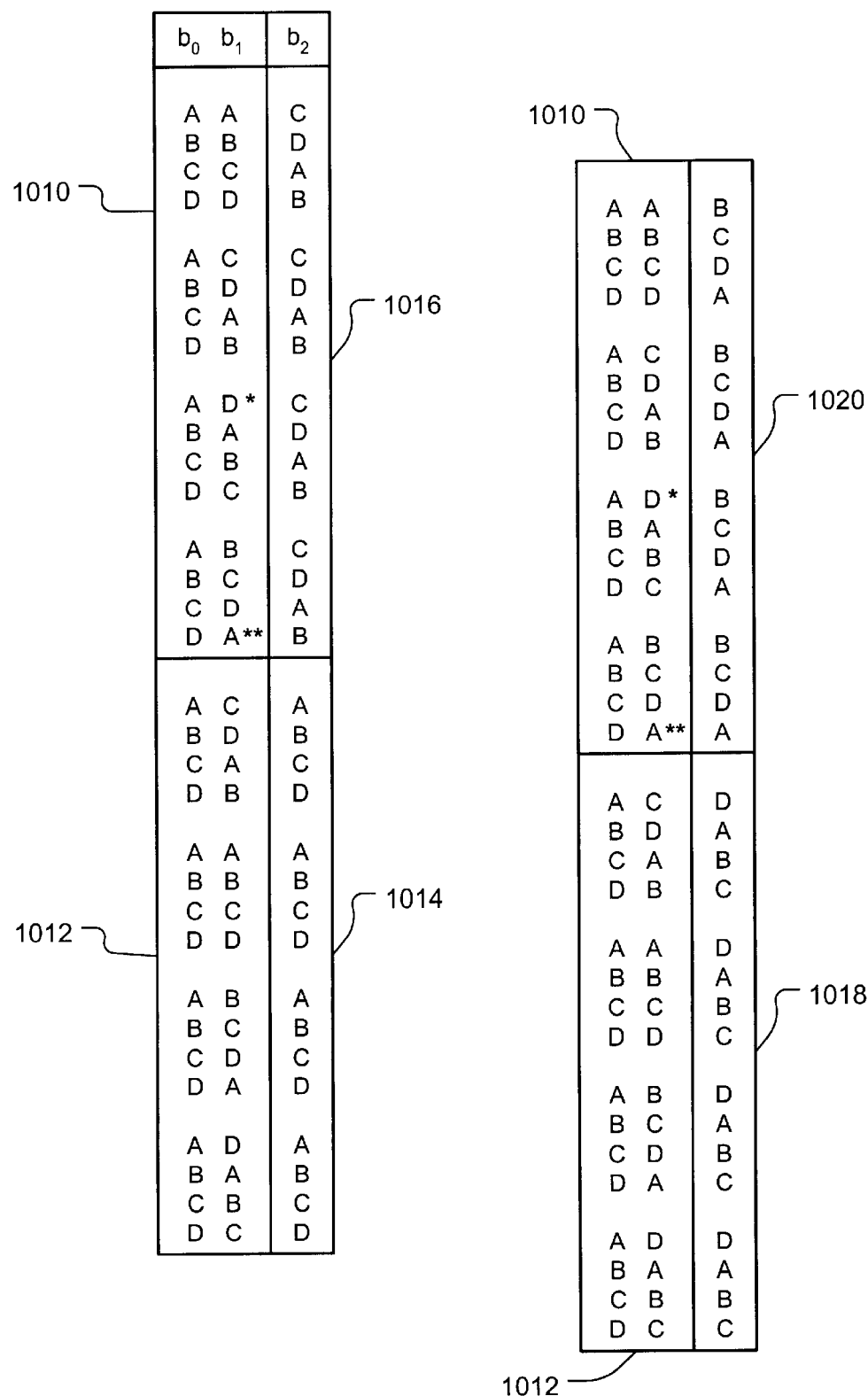

For the addressing of $L^3$ lines, the twin tables will now have three columns ($b_0$, $b_1$ and $b_2$) and will have the structure shown in FIGS. 10a and 10b. In each of FIGS. 10a and 10b, the column on the right is concatenated to the column on the left. Numeral 1010 refers to the block containing the first two columns of Table 6, and numeral 1012 refers to the block containing the first two columns of Table 7. Numeral 1014 refers to the sequence ABCD repeated four times, numeral 1016 refers to the sequence CDAB repeated four times, numeral 1018 refers to the sequence DABC repeated four times, and numeral 1020 refers to the sequence BCDA repeated four times, The method of FIG. 9 can be further extended to $L^4$ memory lines and 4n address lines, and so on.

The construction of the twin tables and the extension to large memory arrays can be made if there exists indices $c_0$, $c_1$ and $c_2$ between 1 and L such that the original address protocol T for L memory lines is neighborhood-disjoint and, in addition, the following six conditions are satisfied:

(a) $c_0$ and $c_1$ have different parity (as integers).

(b) $c_2$ and $c_3$ have different parity (as integers).

(c) $T(c_0+1) \wedge T(c_1) = 0$.

(d) $T(c_1+1) \wedge T(c_2) = 0$.

(e) $T(c_2+1) \wedge T(c_3) = 0$.

(f) $T(C_3+1) \wedge T(c_0) = 0$.

An index value of L+1 should be interpreted as 1. Thus, if L=4, T(1)=A, T(2)=B, T(3)=C and T(4)=D, and A∧C=0 and B∧D=0, then conditions (a)–(f) hold for $c_0 = 1$, $c_1 = 4$, $c_2 = 3$, and $c_3 = 2$.

The method of FIG. 9 is not limited to extending the fault-tolerant and/or neighorhood-disjoint address configurations generated by the methods shown in FIGS. 7 and 8. The address configurations may be generated by other methods as well.

The address protocols described above are not limited to the memory device described above. They may be applied to any memory device using combinatorial address logic.

The present invention is not limited to the specific embodiments described and illustrated above. Instead, the present invention is construed according to the claims that follow.

What is claimed is:

1. A method of using a sequence of address configurations covering L memory lines and n address lines, the method comprising:

forming L blocks, a most significant column of each block filled with the sequence such that th most significant column of each block contains the same unshifted sequence;

a least significant column of each block filled with the sequence such that entries in the least significant column of the blocks are shifted cyclically;

whereby the L blocks contain address configurations for $L^2$ memory lines and 2n address lines.

2. The method of claim 1, wherein the cyclical shift for each block is unique.

3. The method of claim 1, wherein the $i^{th}$ entry in the most significant column of each block is equal to the $i^{th}$ entry of the sequence.

4. The method of claim 1, wherein the $i^{th}$ entry in the least significant column of the $k^{th}$ block is equal to the $(i+s(k))^{th}$ entry of the sequence, where s(k) is an amount of shift.

5. The method of claim 4, wherein $s(k) = s(k-1) - 2$ for odd L.

6. The method of claim 1, wherein the L blocks comprise a first table; and wherein the method further comprises forming a twin table from the first table when L is even.

7. The method of claim 6, wherein the first table is appended to the end of the twin table.

8. The method of claim 6, wherein the twin table is appended to the end of the first table.

9. The method of claim 6, wherein there exists indices $c_0$, $c_1$, $c_2$, and $c_3$ between 1 and L such that the sequence covering the L memory lines is neighborhood-disjoint and, in addition, the following six conditions are satisfied: $c_0$ and $c_1$ have different parity (as integers); $c_2$ and $C_3$ have different parity (as integers); $T(c_1+1) \wedge T(c_2) = 0$; $T(c_0+1) \wedge T(c_1) = 0$; $T(c_2+1) \wedge T(c_3) = 0$; and $T(c_3+1) \wedge T(c_0) = 0$, where T(j) is the address configuration of the $j^{th}$ memory line.

10. The method of claim 1, wherein the sequence is obtained from a lookup table.

11. The method of claim 1, wherein the sequence was also generated by using the method of claim 1.

12. A method of generating address configurations for a memory device, the method comprising accessing a sequence of address configurations for L memory lines and n address lines; and forming L blocks, wherein an $i^{th}$ entry in a most significant column of each block is equal to the $i^{th}$ entry of the sequence, and an $i^{th}$ entry in a least significant column of the $k^{th}$ block is equal to the $(i+s(k))^{th}$ entry of the sequence, where s(k) is the amount of shift for the $k^{th}$ block.

13. The method of claim 12, wherein the amount of shift for each block is unique.

14. The method of claim 12, wherein $s(k) = s(k-1) - 2$ for odd L.

15. The method of claim 12, wherein the L blocks comprise a first table; and wherein the method further comprises forming a twin table from the first table when L is even.

16. The method of claim 12, wherein the sequence is obtained from a lookup table.

17. The method of claim 12, wherein the sequence was also generated by using the method of claim 12.

18. A method of using a lookup table to generate address configurations for a memory device, the lookup table including address configurations for L memory lines and n address lines, the method comprising forming L blocks, wherein a $i^{th}$ entry in a most significant column of each block is equal to the $i^{th}$ entry of the lookup table, and the $i^{th}$ entry in a least significant column of the $k^{th}$ block is equal to the $(i+s(k))^{th}$ entry of the lookup table, where s(k) is the amount of shift for the $k^{th}$ block.

19. The method of claim 18, wherein the amount of shift for each block is unique.

20. The method of claim 18, wherein $s(k) = s(k-1) - 2$ for odd L.

21. The method of claim 18, wherein the L blocks comprise a first table; and wherein he method further comprises forming a twin table from the first table when L is even.

* * * * *